US011238772B2

United States Patent
Pullakavi et al.

(10) Patent No.: US 11,238,772 B2
(45) Date of Patent: Feb. 1, 2022

(54) METHODS AND APPARATUS FOR COMPOSITOR LEARNING MODELS

(71) Applicant: QUALCOMM Incorporated, San Diego, CA (US)

(72) Inventors: Srinivas Pullakavi, Kakinada (IN); Dileep Marchya, Hyderabad (IN); Padmanabhan Komanduru V, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/823,041

(22) Filed: Mar. 18, 2020

(65) Prior Publication Data

US 2021/0295754 A1  Sep. 23, 2021

(51) Int. Cl.
G09G 3/20 (2006.01)
G06T 1/20 (2006.01)
G06N 20/00 (2019.01)
G06F 30/27 (2020.01)

(52) U.S. Cl.
CPC ............ G09G 3/20 (2013.01); G06F 30/27 (2020.01); G06N 20/00 (2019.01); G06T 1/20 (2013.01); G09G 2360/08 (2013.01)

(58) Field of Classification Search
CPC ............ G06N 20/00; G06F 30/27; G06T 1/20
USPC ...................................................... 345/501
See application file for complete search history.

(56) References Cited

U.S. PATENT DOCUMENTS

| | | | | |
|---|---|---|---|---|
| 2011/0014932 A1* | 1/2011 | Estevez | ................. | H04M 1/576 455/466 |
| 2015/0178880 A1* | 6/2015 | Kruglick | .................. | G06T 1/20 345/502 |
| 2015/0317825 A1* | 11/2015 | Hazel | ..................... | G06T 15/06 345/426 |
| 2016/0188279 A1* | 6/2016 | Rajamani | ................. | G09G 5/14 345/2.3 |
| 2020/0034665 A1* | 1/2020 | Ghanta | ................... | G06F 17/18 |
| 2020/0357142 A1* | 11/2020 | Aydin | .................... | G06T 7/194 |

* cited by examiner

*Primary Examiner* — Hai Tao Sun
(74) *Attorney, Agent, or Firm* — Campbell C. Chiang

(57) ABSTRACT

The present disclosure relates to methods and apparatus for display processing. The apparatus can determine at least one data parameter corresponding to each of a plurality of layers in a display frame. The apparatus can also calculate a model for the at least one data parameter corresponding to each of the plurality of layers. Additionally, the apparatus can modify the model for the at least one data parameter based on one or more application use cases of the display frame. Moreover, the apparatus can implement the modified model on each of the plurality of layers in the display frame. In some aspects, the apparatus can also determine one or more composition settings for each of the plurality of layers based on the modified model. The apparatus can also apply the one or more composition settings to each of the plurality of layers based on the modified model.

30 Claims, 5 Drawing Sheets

METHODS AND APPARATUS FOR COMPOSITOR LEARNING MODELS

TECHNICAL FIELD

The present disclosure relates generally to processing systems and, more particularly, to one or more techniques for frame or graphics processing.

INTRODUCTION

Computing devices often utilize a graphics processing unit (GPU) to accelerate the rendering of graphical data for display. Such computing devices may include, for example, computer workstations, mobile phones such as so-called smartphones, embedded systems, personal computers, tablet computers, and video game consoles. GPUs execute a graphics processing pipeline that includes one or more processing stages that operate together to execute graphics processing commands and output a frame. A central processing unit (CPU) may control the operation of the GPU by issuing one or more graphics processing commands to the GPU. Modern day CPUs are typically capable of concurrently executing multiple applications, each of which may need to utilize the GPU during execution. A device that provides content for visual presentation on a display generally includes a GPU.

Typically, a GPU of a device is configured to perform the processes in a graphics processing pipeline. However, with the advent of wireless communication and smaller, handheld devices, there has developed an increased need for improved graphics processing.

SUMMARY

The following presents a simplified summary of one or more aspects in order to provide a basic understanding of such aspects. This summary is not an extensive overview of all contemplated aspects, and is intended to neither identify key elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a compositor, a frame compositor, a composer, a hardware composer, a frame composer, a frame processor, a display processor, a display processing unit (DPU), a CPU, or a GPU. The apparatus can determine at least one data parameter corresponding to each of a plurality of layers in a display frame. The apparatus can also calculate a model for the at least one data parameter corresponding to each of the plurality of layers. Also, the apparatus can store the model for the at least one data parameter corresponding to each of the plurality of layers. The apparatus can also modify the model for the at least one data parameter based on one or more application use cases of the display frame. The apparatus can also perform the one or more application use cases of the display frame to modify the model. In some aspects, the apparatus can determine one or more composition settings for each of the plurality of layers based on the modified model. Moreover, the apparatus can implement the modified model on each of the plurality of layers in the display frame. The apparatus can also apply the one or more composition settings to each of the plurality of layers based on the modified model. Further, the apparatus can receive feedback based on the one or more composition settings for each of the plurality of layers based on the modified model. The apparatus can also modify the model for the at least one data parameter based on the received feedback. The apparatus can also modify the determined at least one data parameter corresponding to each of the plurality of layers based on the received feedback.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
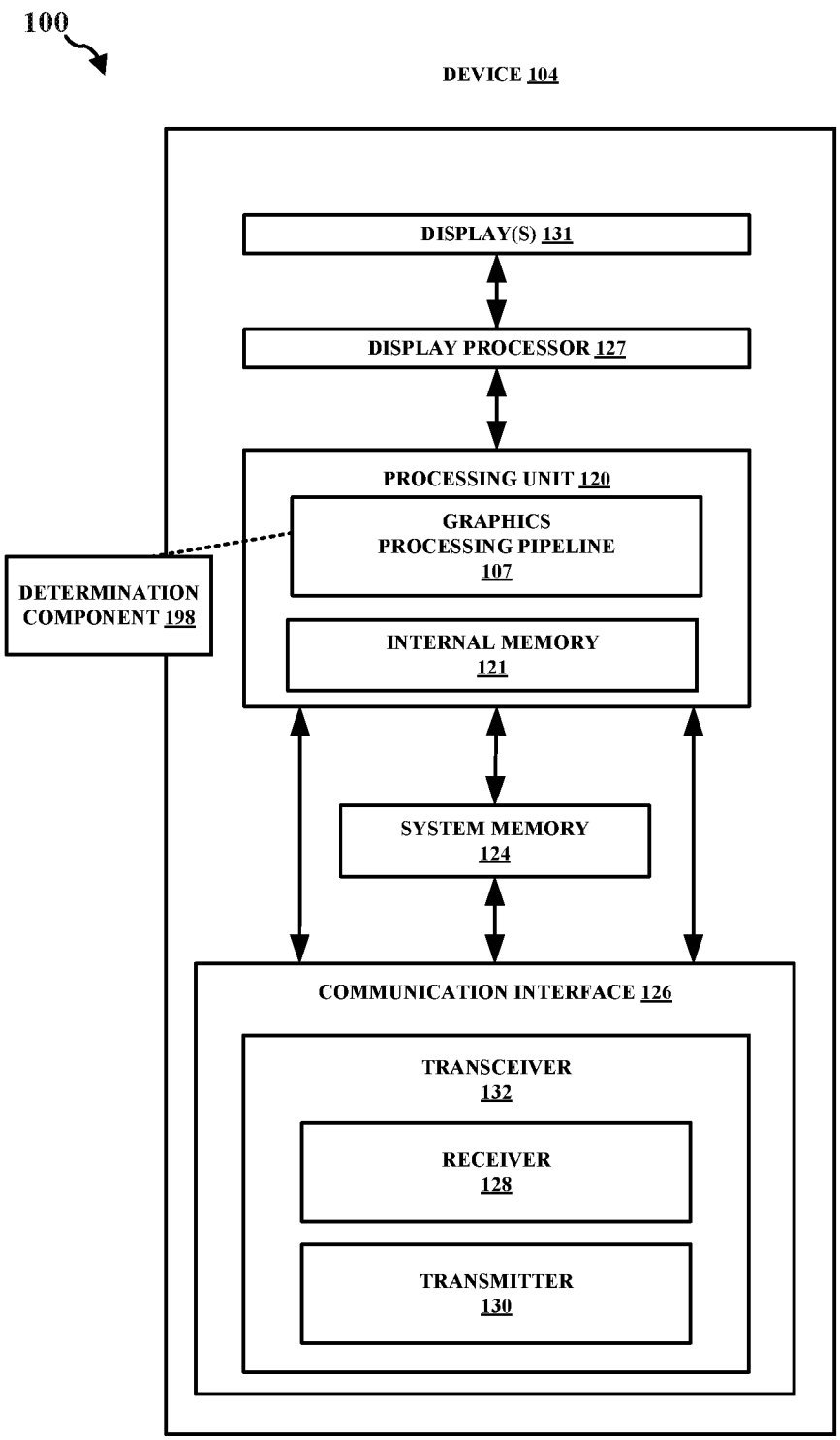
FIG. 1 is a block diagram that illustrates an example content generation system in accordance with one or more techniques of this disclosure.

GPUs may perform a full or partial composition of display layers when a DPU cannot handle the composition workload. When a GPU composes a portion of the display layers, this can increase the processing time and result in a backlog in the display pipeline and/or cause an increase in janks. Partial GPU composition processes can also include a high power use and/or interference with other application processing. Other partial GPU compositions may not reduce the processing time enough to reduce or eliminate janks. This can be due to inter-process communication (IPC) between several components, e.g., a compositor and a hardware composer. Aspects of the present disclosure can include partial GPU compositions that utilize a low amount of power and do not interfere with other application processing. Partial GPU compositions of the present disclosure can also reduce the processing time to reduce janks. In some aspects, the present disclosure may include a learning model in which a compositor process studies a GPU composition decision pattern for various application layouts by a hardware composer process. The present disclosure can then apply such GPU composition decisions in advance thereafter in order to save on processing time. The learning model can be part of the compositor process, as well as utilize past data or heuristics in order to build the layer geometry. So over a period of time, the learning model can determine which layers may need GPU composition, as well as which layers can utilize a full DPU composition.

Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different wireless technologies, system configurations, networks, and transmission protocols, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors (which may also be referred to as processing units). Examples of processors include microprocessors, microcontrollers, graphics processing units (GPUs), general purpose GPUs (GPGPUs), central processing units (CPUs), application processors, digital signal processors (DSPs), reduced instruction set computing (RISC) processors, systems-on-chip (SOC), baseband processors, application specific integrated circuits (ASICs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software can be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise. The term application may refer to software. As described herein, one or more techniques may refer to an application, i.e., software, being configured to perform one or more functions. In such examples, the application may be stored on a memory, e.g., on-chip memory of a processor, system memory, or any other memory. Hardware described herein, such as a processor may be configured to execute the application. For example, the application may be described as including code that, when executed by the hardware, causes the hardware to perform one or more techniques described herein. As an example, the hardware may access the code from a memory and execute the code accessed from the memory to perform one or more techniques described herein. In some examples, components are identified in this disclosure. In such examples, the components may be hardware, software, or a combination thereof. The components may be separate components or sub-components of a single component.

Accordingly, in one or more examples described herein, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

In general, this disclosure describes techniques for having a graphics processing pipeline in a single device or multiple devices, improving the rendering of graphical content, and/or reducing the load of a processing unit, i.e., any processing unit configured to perform one or more techniques described herein, such as a GPU. For example, this disclosure describes techniques for graphics processing in any device that utilizes graphics processing. Other example benefits are described throughout this disclosure.

As used herein, instances of the term "content" may refer to "graphical content," "image," and vice versa. This is true regardless of whether the terms are being used as an adjective, noun, or other parts of speech. In some examples, as used herein, the term "graphical content" may refer to a content produced by one or more processes of a graphics processing pipeline. In some examples, as used herein, the term "graphical content" may refer to a content produced by a processing unit configured to perform graphics processing. In some examples, as used herein, the term "graphical content" may refer to a content produced by a graphics processing unit.

In some examples, as used herein, the term "display content" may refer to content generated by a processing unit configured to perform displaying processing. In some examples, as used herein, the term "display content" may refer to content generated by a display processing unit. Graphical content may be processed to become display content. For example, a graphics processing unit may output graphical content, such as a frame, to a buffer (which may be referred to as a framebuffer). A display processing unit may read the graphical content, such as one or more frames from the buffer, and perform one or more display processing techniques thereon to generate display content. For example, a display processing unit may be configured to perform composition on one or more rendered layers to generate a frame. As another example, a display processing unit may be configured to compose, blend, or otherwise combine two or more layers together into a single frame. A display processing unit may be configured to perform scaling, e.g., upscaling or downscaling, on a frame. In some examples, a frame may refer to a layer. In other examples, a frame may refer to two or more layers that have already been blended together to form the frame, i.e., the frame includes two or more layers, and the frame that includes two or more layers may subsequently be blended.

FIG. 1 is a block diagram that illustrates an example content generation system 100 configured to implement one or more techniques of this disclosure. The content generation system 100 includes a device 104. The device 104 may include one or more components or circuits for performing various functions described herein. In some examples, one or more components of the device 104 may be components of an SOC. The device 104 may include one or more components configured to perform one or more techniques of this disclosure. In the example shown, the device 104 may include a processing unit 120, and a system memory 124. In some aspects, the device 104 can include a number of optional components, e.g., a communication interface 126, a transceiver 132, a receiver 128, a transmitter 130, a display processor 127, and one or more displays 131. Reference to the display 131 may refer to the one or more displays 131. For example, the display 131 may include a single display or multiple displays. The display 131 may include a first display and a second display. The first display may be a left-eye display and the second display may be a right-eye display. In some examples, the first and second display may receive different frames for presentment thereon. In other examples, the first and second display may receive the same frames for presentment thereon. In further examples, the results of the graphics processing may not be displayed on the device, e.g., the first and second display may not receive any frames for presentment thereon. Instead, the frames or graphics processing results may be transferred to another device. In some aspects, this can be referred to as split-rendering.

The processing unit 120 may include an internal memory 121. The processing unit 120 may be configured to perform graphics processing, such as in a graphics processing pipeline 107. In some examples, the device 104 may include a display processor, such as the display processor 127, to perform one or more display processing techniques on one or more frames generated by the processing unit 120 before presentment by the one or more displays 131. The display processor 127 may be configured to perform display processing. For example, the display processor 127 may be configured to perform one or more display processing techniques on one or more frames generated by the processing unit 120. The one or more displays 131 may be configured to display or otherwise present frames processed by the display processor 127. In some examples, the one or more displays 131 may include one or more of: a liquid crystal display (LCD), a plasma display, an organic light emitting diode (OLED) display, a projection display device, an augmented reality display device, a virtual reality display device, a head-mounted display, or any other type of display device.

Memory external to the processing unit 120, such as system memory 124, may be accessible to the processing unit 120. For example, the processing unit 120 may be configured to read from and/or write to external memory, such as the system memory 124. The processing unit 120 may be communicatively coupled to the system memory 124 over a bus. In some examples, the processing unit 120 may be communicatively coupled to each other over the bus or a different connection.

The internal memory 121 or the system memory 124 may include one or more volatile or non-volatile memories or storage devices. In some examples, internal memory 121 or the system memory 124 may include RAM, SRAM, DRAM, erasable programmable ROM (EPROM), electrically erasable programmable ROM (EEPROM), flash memory, a magnetic data media or an optical storage media, or any other type of memory.

The internal memory 121 or the system memory 124 may be a non-transitory storage medium according to some examples. The term "non-transitory" may indicate that the storage medium is not embodied in a carrier wave or a propagated signal. However, the term "non-transitory" should not be interpreted to mean that internal memory 121 or the system memory 124 is non-movable or that its contents are static. As one example, the system memory 124 may be removed from the device 104 and moved to another device. As another example, the system memory 124 may not be removable from the device 104.

The processing unit 120 may be a central processing unit (CPU), a graphics processing unit (GPU), a general purpose GPU (GPGPU), or any other processing unit that may be configured to perform graphics processing. In some examples, the processing unit 120 may be integrated into a motherboard of the device 104. In some examples, the processing unit 120 may be present on a graphics card that is installed in a port in a motherboard of the device 104, or may be otherwise incorporated within a peripheral device configured to interoperate with the device 104. The processing unit 120 may include one or more processors, such as one or more microprocessors, GPUs, application specific integrated circuits (ASICs), field programmable gate arrays (FPGAs), arithmetic logic units (ALUs), digital signal processors (DSPs), discrete logic, software, hardware, firmware, other equivalent integrated or discrete logic circuitry, or any combinations thereof. If the techniques are implemented partially in software, the processing unit 120 may store instructions for the software in a suitable, non-transitory computer-readable storage medium, e.g., internal memory 121, and may execute the instructions in hardware using one or more processors to perform the techniques of this disclosure. Any of the foregoing, including hardware, software, a combination of hardware and software, etc., may be considered to be one or more processors.

In some aspects, the content generation system 100 can include an optional communication interface 126. The communication interface 126 may include a receiver 128 and a transmitter 130. The receiver 128 may be configured to perform any receiving function described herein with respect to the device 104. Additionally, the receiver 128 may be configured to receive information, e.g., eye or head position information, rendering commands, or location information, from another device. The transmitter 130 may be configured to perform any transmitting function described herein with respect to the device 104. For example, the transmitter 130 may be configured to transmit information to another device, which may include a request for content. The receiver 128 and the transmitter 130 may be combined into a transceiver 132. In such examples, the transceiver 132 may be configured to perform any receiving function and/or transmitting function described herein with respect to the device 104.

Referring again to FIG. 1, in certain aspects, the graphics processing pipeline 107 may include a determination component 198 configured to determine at least one data parameter corresponding to each of a plurality of layers in a display frame. The determination component 198 can also be configured to calculate a model for the at least one data parameter corresponding to each of the plurality of layers. The determination component 198 can also be configured to store the model for the at least one data parameter corresponding to each of the plurality of layers. The determination component 198 can also be configured to modify the model for the at least one data parameter based on one or more application use cases of the display frame. The determination component 198 can also be configured to perform the one or more application use cases of the display frame to modify the model. The determination component 198 can also be configured to determine one or more composition settings for each of the plurality of layers based on the modified model. The determination component 198 can also be configured to implement the modified model on each of the plurality of layers in the display frame. The determination component 198 can also be configured to apply the one or more composition settings to each of the plurality of layers based on the modified model. The determination component 198 can also be configured to receive feedback based on the one or more composition settings for each of the plurality of layers based on the modified model. The determination component 198 can also be configured to modify the model for the at least one data parameter based on the received feedback. The determination component 198 can also be configured to modify the determined at least one data parameter corresponding to each of the plurality of layers based on the received feedback.

As described herein, a device, such as the device 104, may refer to any device, apparatus, or system configured to perform one or more techniques described herein. For example, a device may be a server, a base station, user equipment, a client device, a station, an access point, a computer, e.g., a personal computer, a desktop computer, a laptop computer, a tablet computer, a computer workstation, or a mainframe computer, an end product, an apparatus, a phone, a smart phone, a server, a video game platform or console, a handheld device, e.g., a portable video game device or a personal digital assistant (PDA), a wearable computing device, e.g., a smart watch, an augmented reality device, or a virtual reality device, a non-wearable device, a display or display device, a television, a television set-top box, an intermediate network device, a digital media player, a video streaming device, a content streaming device, an in-car computer, any mobile device, any device configured to generate graphical content, or any device configured to perform one or more techniques described herein. Processes herein may be described as performed by a particular component (e.g., a GPU), but, in further embodiments, can be performed using other components (e.g., a CPU), consistent with disclosed embodiments.

GPUs can process multiple types of data or data packets in a GPU pipeline. For instance, in some aspects, a GPU can process two types of data or data packets, e.g., context register packets and draw call data. A context register packet can be a set of global state information, e.g., information regarding a global register, shading program, or constant data, which can regulate how a graphics context will be processed. For example, context register packets can include information regarding a color format. In some aspects of context register packets, there can be a bit that indicates which workload belongs to a context register. Also, there can be multiple functions or programming running at the same time and/or in parallel. For example, functions or programming can describe a certain operation, e.g., the color mode or color format. Accordingly, a context register can define multiple states of a GPU.

Context states can be utilized to determine how an individual processing unit functions, e.g., a vertex fetcher (VFD), a vertex shader (VS), a shader processor, or a geometry processor, and/or in what mode the processing unit functions. In order to do so, GPUs can use context registers and programming data. In some aspects, a GPU can generate a workload, e.g., a vertex or pixel workload, in the pipeline based on the context register definition of a mode or state. Certain processing units, e.g., a VFD, can use these states to determine certain functions, e.g., how a vertex is assembled. As these modes or states can change, GPUs may need to change the corresponding context. Additionally, the workload that corresponds to the mode or state may follow the changing mode or state.

Figure 2:
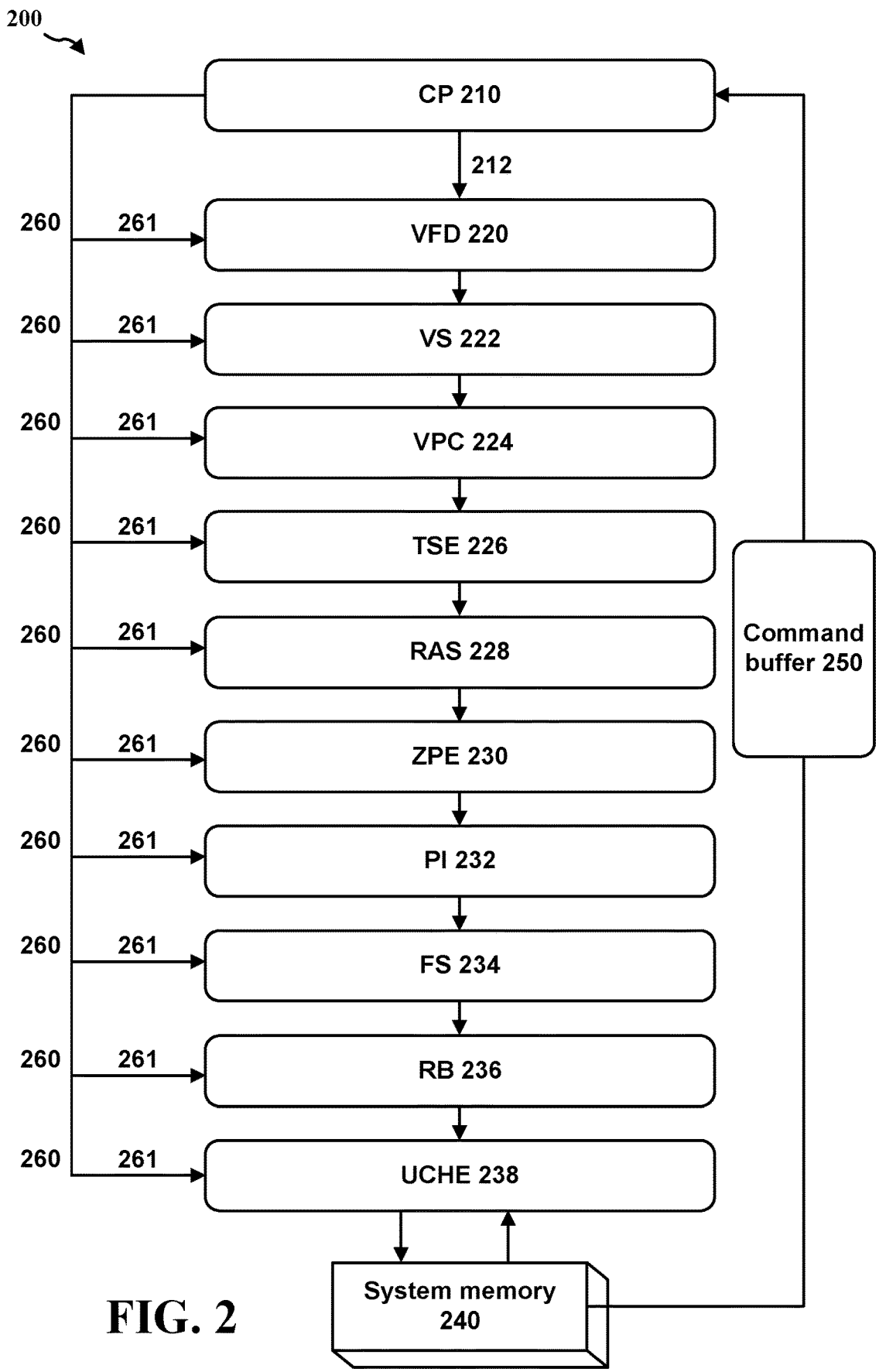
FIG. 2 illustrates an example GPU in accordance with one or more techniques of this disclosure.

FIG. 2 illustrates an example GPU 200 in accordance with one or more techniques of this disclosure. As shown in FIG. 2, GPU 200 includes command processor (CP) 210, draw call packets 212, VFD 220, VS 222, vertex cache (VPC) 224, triangle setup engine (TSE) 226, rasterizer (RAS) 228, Z process engine (ZPE) 230, pixel interpolator (PI) 232, fragment shader (FS) 234, render backend (RB) 236, L2 cache (UCHE) 238, and system memory 240. Although FIG. 2 displays that GPU 200 includes processing units 220-238, GPU 200 can include a number of additional processing units. Additionally, processing units 220-238 are merely an example and any combination or order of processing units can be used by GPUs according to the present disclosure. GPU 200 also includes command buffer 250, context register packets 260, and context states 261.

As shown in FIG. 2, a GPU can utilize a CP, e.g., CP 210, or hardware accelerator to parse a command buffer into context register packets, e.g., context register packets 260, and/or draw call data packets, e.g., draw call packets 212. The CP 210 can then send the context register packets 260 or draw call data packets 212 through separate paths to the processing units or blocks in the GPU. Further, the command buffer 250 can alternate different states of context registers and draw calls. For example, a command buffer can be structured in the following manner: context register of context N, draw call(s) of context N, context register of context N+1, and draw call(s) of context N+1.

Aspects of mobile devices or smart phones can utilize buffer mechanisms to distribute or coordinate a buffer between an application rendering side of the device, e.g., a GPU or CPU, and a display or composition side of the device, e.g., a display engine. For instance, some mobile devices can utilize a buffer queue mechanism to distribute or coordinate a buffer between an application rendering side and a display or composition side, which can include a buffer compositor or a hardware composer (HWC). In some aspects, the application rendering side can be referred to as a producer, while the display or composition side can be referred to as a consumer. Additionally, a synchronization divider or fence can be used to synchronize content between the application rendering side and the display or composition side. Accordingly, a fence can be referred to as a synchronization divider, and vice versa.

A variety of factors can be performance indicators for display processing between an application rendering side and a display or composition side. For instance, frames per second (FPS) and janks, i.e., delays or pauses in frame rendering or composition, are key performance indicators (KPI). In some aspects, a jank can be a perceptible pause in the rendering of a software application's user interface. Both FPS and janks are KPIs in game performance and/or device display capability. In some applications, janks can be the result of a number of factors, such as slow operations or poor interface design. In some instances, a jank can also correspond to a change in the refresh rate of the display at the device. Janks are important to gaming applications because if the display fresh latency is not stable, this can impact the user experience. Accordingly, some aspects of the mobile gaming industry are focused on reducing janks and increasing FPS.

Application can run at a variety of different FPS modes. In some aspects, applications can run at 30 FPS mode. In other aspects, applications can run at different FPS modes, e.g., 20 or 60 FPS. Aspects of the present disclosure can include a current frame latency time, which can refer to the time difference between when a previous frame completes being displayed and when a current frame completes being displayed. The frame latency time can also refer to the time between successive refreshing frames. The frame latency time can also be based on a frame rate. For instance, the frame latency time for each frame can be 33.33 ms (e.g., corresponding to 30 FPS), 16.67 ms (e.g., corresponding to 60 FPS), or 50 ms (e.g., corresponding to 20 FPS).

Jank reduction technology can be utilized in a number of different scenarios. For instance, slow frames, e.g., frames under 30 FPS, may optimize janks reduction differently than fast frames. For example, there may be frame pacing issues for frames under 30 FPS, which may utilize a different janks reduction technology than faster frames. In some aspects, different mechanisms or designs may have the ability to detect janks. Also, once janks are detected, other mechanisms can be triggered. For example, a compositor can be directly triggered to bypass a vertical synchronization (VSYNC) time in order to avoid janks. In some aspects, the threshold of the janks reduction technology may be platform dependent, which may need certain tuning efforts.

As indicated herein, if a frame takes too long to be rendered and is not ready for transmission to a display at a scheduled VSYNC time, this can result in a delayed frame display time and a corresponding jank. As such, janks can be the result of a delayed frame rendering. In some aspects, a frame buffer or buffer queue can queue frames waiting to be sent to the display. If a frame takes too long to be rendered, then the frame may not be consumed or sent to the buffer queue by the scheduled VSYNC time.

In some aspects, a compositor consume the frame or help send the frame buffer to the display. If the renderer takes too long to render a frame, then the compositor may be delayed in consuming the frame, so the frame will be delayed in being transmitted to the display. As such, a delay in rendering can cause a resulting delay in frame consumption or display transmission. In some aspects, if a frame has not finished rendering by a scheduled VSYNC time, then the frame will not be consumed by the composer until the next VSYNC time. In these aspects, if there are no frames in the buffer queue, then the compositor may not be triggered to consume the frame. As the frame is not consumed, this can result in a jank.

Certain types of displays are becoming increasingly popular in smart devices or smartphones. For example, 90 Hz and 120 Hz displays are being utilized at an increased rate in the smartphone industry. For instances, original equipment manufacturers (OEMs) are prototyping and pursuing 90 Hz and 120 Hz displays across all market tiers. Accordingly, there is a present need to reduce the amount of janks and/or power utilized in these types of displays.

In some aspects, display software can finish an entire frame processing within a display processing time, e.g., less than 8.33 ms for a 120 Hz display. This frame processing can be spread across a compositor or frame compositor process, a composer or hardware composer process, e.g., a hardware abstraction layer (HAL), a display driver, e.g., a direct rendering manager (DRM) driver, and/or an application program interface (API), e.g., an open graphics library (OpenGL) driver.

As indicated above, the display processing time can be spread across each of a variety of components. Also, each of these components can work together to render different display layers and/or display the layers on the display or panel. For instance, the compositor or frame compositor can communicate with the display or display driver based on the application use case. The compositor can also build layer attributes for the panel or display.

In some instances, the display processor or DPU may perform the composition for each of the layers to be displayed at the panel or display. For instance, the composition can include implementing each of the display layers together and/or displaying the layers on the panel. In addition, the display software can allow for the GPU hardware to compose the layers or signal whether the GPU will be involved in the composition process. For example, in some aspects, the GPU can render each of the display layers, e.g., a wallpaper layer or a status bar layer. The software processing for the composition can take a certain processing time, e.g., around 3.5 ms, when all of the layers are composed by the DPU. In some instances, this processing time can be reduced when each of the software path optimizations qualify and the API or OpenGL interaction is not necessary for the composition.

As indicated above, the GPU may perform a full or partial composition of the display layers, e.g., when the DPU cannot handle the workload. If GPU composition is needed on the display layers, the processing time can increase compared to DPU composition, e.g., by around 10 ms. Also, taking on a portion of the display composition can increase the workload on the GPU. So the workload on the GPU can be reduced when the DPU composes as many display layers as possible. In some aspects, layers are transferred to the GPU for composition due to a composition optimization, e.g., static layer caching, or DPU hardware limitations, e.g., pipes, scaling, etc. Additionally, the compositor can determine which display layers may be composed by the DPU or GPU. In some aspects, the hardware may communicate that one or more layers are unable to be composed by the DPU, so it can request the GPU to perform at least a partial composition of the display layers.

The aforementioned increase in processing time when a GPU composes a portion of display layers can result in a backlog in the display pipeline and/or cause an increase in janks. For instance, the aforementioned display processing may need to be performed within a display processing time to reduce the display pipeline backlog or decrease janks. For example, the display processing time can be less than 8.33 ms for a 120 Hz display. If the display processing is longer than the display processing time, this can cause a backlog in the pipeline and result in janks. This can be a common problem on certain display chipsets, which can even affect 60 Hz displays with a longer processing time than 120 Hz displays, e.g., 16.67 ms for 60 Hz compared to 8.33 ms for 120 Hz.

Figure 3:
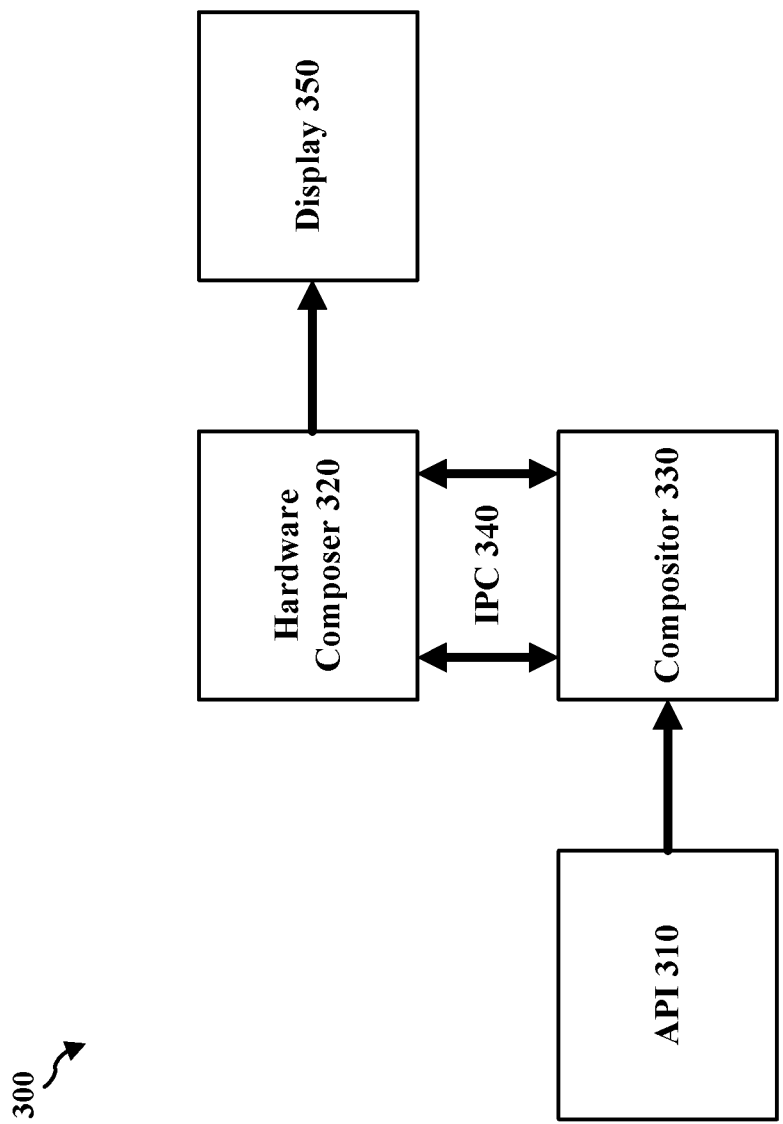
FIG. 3 illustrates an example diagram of frame processing in accordance with one or more techniques of this disclosure.

FIG. 3 illustrates diagram 300 in accordance with one or more techniques of this disclosure. More specifically, diagram 300 includes component frame processing in a partial GPU composition mode. As shown in FIG. 3, diagram 300 includes application program interface (API) 310, hardware composer 320, compositor 330, inter-process communication (IPC) 340, and display 350. FIG. 3 illustrates the communication of each of the components during frame processing.

As shown in FIG. 3, the API 310 can communicate with the compositor 330. Also, the hardware composer 320 can communicate with the compositor 330. Moreover, the hardware composer 320 can communicate with the display 350. The communication between the hardware composer 320 and the compositor 330 can correspond to inter-process communication (IPC) 340. As described herein, the IPC 340 can result in an increased processing time and/or an increase in the amount of janks. Further, the IPC 340 can result in an increased power use and/or an interference with the processing of other applications.

As indicated above, there are a number of issues with partial GPU composition processes. In some instances, a partial GPU composition can affine a composer processes, e.g., to CPU cores. Although this may reduce processing time, this technique includes the aforementioned high power use and/or interference with other application processing. Other partial GPU compositions do not reduce the processing time enough to reduce or eliminate janks. As indicated in FIG. 3, this can be due to inter-process communication (IPC) between a compositor, e.g., compositor 330, and a hardware composer, e.g., hardware composer 320. Accordingly, there is a present need for further optimizations to deal with partial GPU composition when a DPU is unable to handle the entire composition.

Aspects of the present disclosure can include partial GPU compositions that utilize a low amount of power and do not interfere with other application processing. Partial GPU compositions of the present disclosure can also reduce the processing time to reduce a likelihood of janks. In some aspects, the present disclosure may include a learning model in which a compositor process studies a GPU composition decision pattern for various application layouts by a hardware composer process. The present disclosure can then apply such GPU composition decisions in advance in order to reduce the amount of processing time. The learning model can be part of the compositor process, as well as utilize past data or heuristics in order to build the layer geometry. So over a period of time, the learning model can determine which layers may need GPU composition, as well as which layers can utilize a full DPU composition.

As indicated above, the compositor process according to the present disclosure can build its own data process by using a learning model or heuristics to determine which layers can utilize DPU composition and which layers may need GPU composition. By doing so, the present disclosure can eliminate or reduce the inter-process communication (IPC) overhead and speed up the compositor process. So the communication between the hardware and the software can be reduced, as the learning model can determine which layers can be entirely composed by the DPU or which layers may need partial GPU composition.

Aspects of the present disclosure can include a number of different modeling techniques. In some instances, compositor processes herein can build heuristics of layer geometry when a vendor process has decided to compose some layers using the GPU. Also, a vendor process may indicate whether a GPU composition decision is due to a DPU hardware limitation or an optimization. In some aspects, a hash table may be prepared for the layer geometry or layout and a set of layers marked for GPU composition. The layer geometry may include a variety of identifying features, e.g., an application layer name, a z-order, a format, or cropping rectangles. Additionally, hash tables can be stored in a persist memory and/or updated periodically through a hardware composer feedback mechanism.

Aspects of the present disclosure can also include a number of training techniques, which can include multiple types of training for the learning model. In some instances, a number of common use cases or applications can be performed, e.g., during testing, which can generate a calibrated compositor data file. So the data training or learning can take place via testing or a number of other use cases. This data training can be referred to as developing or modifying the data model via training or high intensity testing.

In addition, there can be a unique data file based on the data training for a number of different components, e.g., a display processor, a display resolution, and/or an operating system (OS) combination. The compositor data file can also ease the processing at a user end and/or prevent janks for common use cases. New data files from the leaning model can also be included based on various upgrades. Moreover, the learning model or compositor data file can be upgraded via user testing, as well as shared with other users. As the model trains with an increased amount of data or use cases, the model can become increasingly developed and precise.

In some aspects, different application designs, e.g., user interface (UI) layouts, can be utilized by an end user based on a number of factors, e.g., UI customizations, UI themes, application upgrades, third party applications, and/or multiple displays. For instance, a compositor may extend a compositor data file and/or add new hashes during runtime as new use cases are executed. In some aspects, the hash table can correspond to the learning model, or the hash table can be based on the data that the model utilized to make a determination. Additionally, the hash table can be stored in the persist memory.

In some aspects, based on a number of data parameters, the present disclosure can determine whether one or more layers qualify for GPU composition. The present disclosure can also utilize data parameters in order to determine whether the layers may be composed by a DPU. So based on the data parameters, the present disclosure can create a model to determine whether a set of display layers may need at least partial GPU composition, or whether these display layers can utilize full DPU composition.

Figure 4:
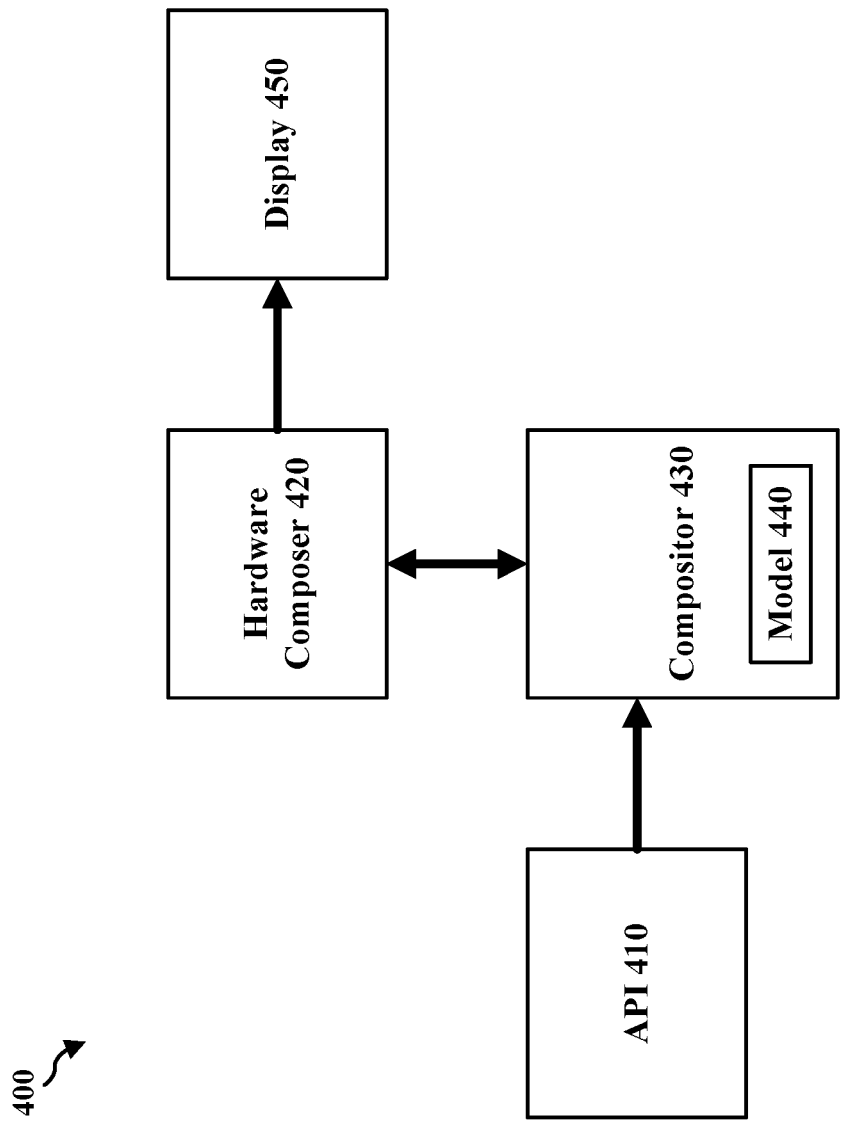
FIG. 4 illustrates an example diagram of frame processing in accordance with one or more techniques of this disclosure.

FIG. 4 illustrates diagram 400 in accordance with one or more techniques of this disclosure. More specifically, diagram 400 includes component frame processing in a partial GPU composition mode. As shown in FIG. 4, diagram 400 includes application program interface (API) 410, hardware composer 420, compositor 430, model 440, and display 450. FIG. 4 illustrates the communication of each of the components during frame processing.

As shown in FIG. 4, the API 410 can communicate with the compositor 430. Additionally, the hardware composer 420 can communicate with the compositor 430. The hardware composer 420 can also communicate with the display 450. Further, compositor 430 can include model 440. As displayed in FIG. 4, the communication between the hardware composer 420 and the compositor 430 may not rise to an interfering level of inter-process communication (IPC). As such, the communication between the hardware composer 420 and the compositor 430 may not increase the processing time and/or increase the amount of janks. Moreover, the reduced communication between the hardware composer 420 and the compositor 430 may result in a reduced amount of power use and/or lack of interference with the processing of other applications.

As shown in FIG. 4, aspects of the present disclosure can include a number of decision making techniques, e.g., via model 440. For instance, compositor 430 may apply advanced GPU composition decisions for layer geometry based on the model 440. As indicated above, these GPU composition decisions may be placed on the GPU because of DPU hardware limitations. Also, these GPU composition decisions based on DPU hardware limitations may remain constant for the same layer geometry. Feedback for such GPU composition decisions can also be solicited or received. So once the model is accurate or developed, then the model can be applied or implemented based on the determined layer geometry.

In some aspects, a compositor, e.g., compositor 430, can gather a few samples of layer geometry, and then analyze the layer parameters which are corresponding to the GPU composition decisions. In addition, the hardware composer 420 may perform a parallel composition on DPU hardware while the GPU composes the frame. By doing so, the GPU may not be bound to finish the composition in the same VSYNC time period. The compositor 430 may also apply the advance GPU composition decisions post sampling and solicit feedback periodically from the hardware composer 420, e.g., during an idle state. So the compositor 430 can implement or apply the model 440 or composition decisions, rather than communicating with the hardware composer 420 regarding the decision making. By doing so, this can reduce the amount of IPC and help the present disclosure to save power.

As indicated above, aspects of the present disclosure can include a number of feedback techniques. For instance, compositor 430 may periodically validate an advanced decision, e.g., using learning model 440, for a given layer geometry with hardware composer 420, e.g., during an idle state. The compositor 430 may correct the decisions based on feedback received from the hardware composer 420. So new use cases can be communicated to the compositor 430 as feedback, e.g., from the hardware composer 420, in order to modify the model 440 based on this feedback. Accordingly, based on the received feedback, the model 440 or composition settings can be modified, such that the accuracy of the future model or data parameters can be improved.

Partial GPU composition techniques of the present disclosure can include a number of advantages or benefits. For instance, aspects of the present disclosure can reduce the amount of janks in a CPU duration per draw cycle, e.g., at a compositor or a hardware composer. For example, aspects of the present disclosure can reduce the amount of janks experienced, e.g., reduce the amount of janks from 10.2% to 1.6% for a 90 FPS display mode. Also, the amount of janks can be reduced from 30.3% to 8.2% for a 120 FPS display mode.

As shown in FIG. 4, aspects of the present disclosure can include a number of different techniques for partial GPU composition. For instance, aspects of the present disclosure, e.g., compositors, hardware composers, frame processors, DPUs, CPUs, or GPUs herein, can include a learning model to account for partial GPU composition. Compositors and hardware composers herein, e.g., compositor 430 and hardware composer 420, can determine at least one data parameter corresponding to each of a plurality of layers in a display frame, e.g., in display 450. In some aspects, the determined at least one data parameter can be based on a GPU composition.

Compositors and hardware composers herein can also calculate a model, e.g., model 440, for the at least one data parameter corresponding to each of the plurality of layers. Also, compositors and hardware composers herein can store the model, e.g., model 440, for the at least one data parameter corresponding to each of the plurality of layers. In some aspects, the model, e.g., model 440, can be stored in a type of memory, such as a persist memory.

Also, compositors and hardware composers herein can modify the model, e.g., model 440, for the at least one data parameter based on one or more application use cases of the display frame. In some instances, the one or more application use cases of the display frame, e.g., display 450, can include at least one of: one or more display use cases, one or more customizations, or one or more third party applications. Compositors and hardware composers herein can also perform the one or more application use cases of the display frame to modify the model, e.g., model 440. In some aspects, a hash table can correspond to the model, e.g., model 440, for the at least one data parameter corresponding to each of the plurality of layers.

Moreover, compositors and hardware composers herein can determine one or more composition settings for each of the plurality of layers based on the modified model, e.g., model 440. Compositors and hardware composers herein can also implement the modified model on each of the plurality of layers in the display frame, e.g., display 450. In some aspects, a compositor, e.g., compositor 430, can implement the modified model, e.g., model 440, on each of the plurality of layers in the display frame, e.g., display 450.

Compositors and hardware composers herein can also apply the one or more composition settings to each of the plurality of layers based on the modified model, e.g., model 440. Further, compositors and hardware composers herein can receive feedback based on the one or more composition settings for each of the plurality of layers based on the modified model, e.g., model 440. In some aspects, the feedback can be received from a hardware composer, e.g., hardware composer 420. Compositors and hardware composers herein can also modify the model, e.g., model 440, for the at least one data parameter based on the received feedback. Compositors and hardware composers herein can also modify the determined at least one data parameter corresponding to each of the plurality of layers based on the received feedback.

Figure 5:
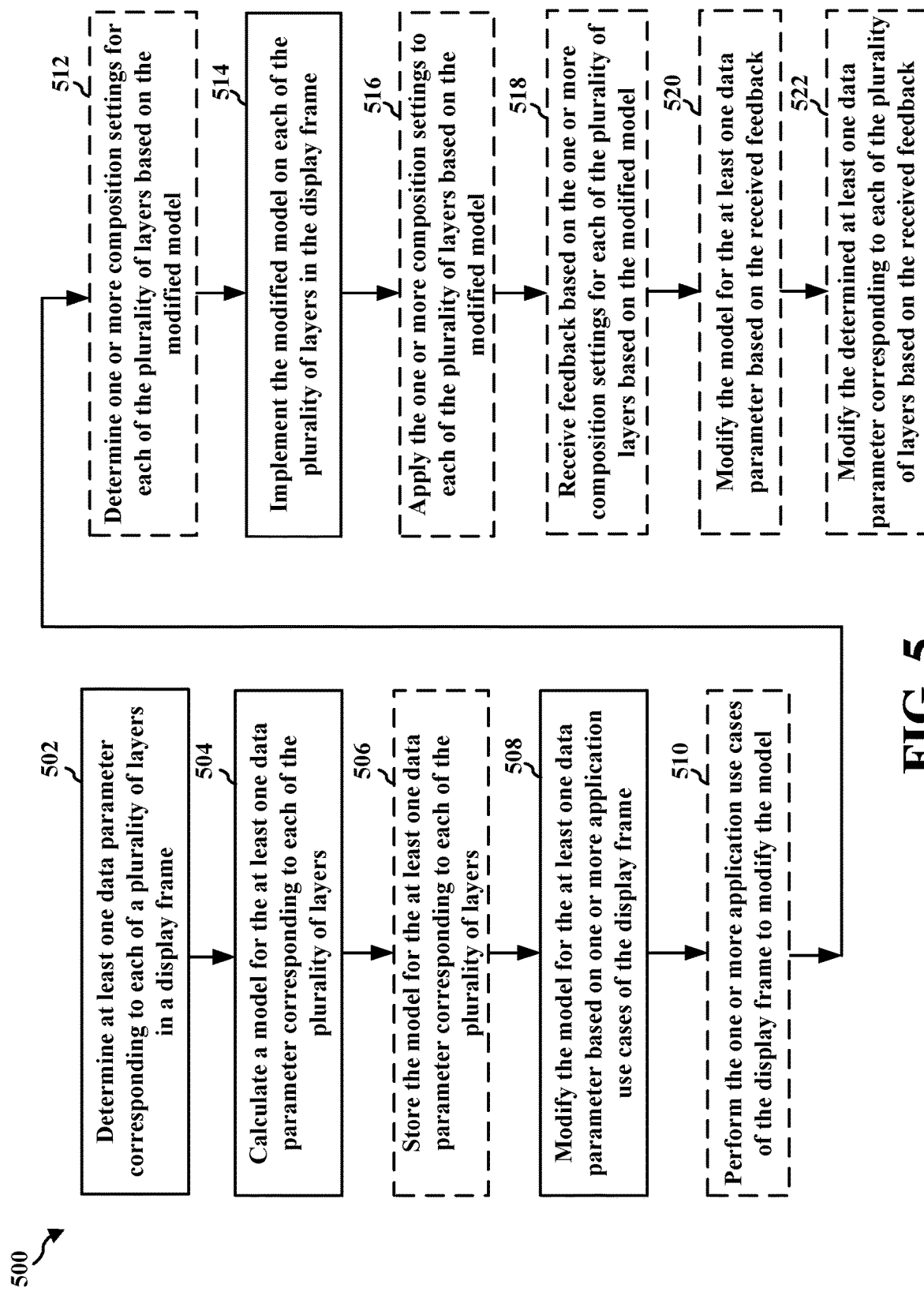
FIG. 5 illustrates an example flowchart of an example method in accordance with one or more techniques of this disclosure.

FIG. 5 illustrates an example flowchart 500 of an example method in accordance with one or more techniques of this disclosure. The method may be performed by an apparatus, e.g., a compositor, a frame compositor, a composer, a hardware composer, a frame composer, a frame processor, a display processor, a display processing unit (DPU), a CPU, a GPU, or an apparatus for frame or graphics processing.

At 502, the apparatus can determine at least one data parameter corresponding to each of a plurality of layers in a display frame, as described in connection with the examples in FIGS. 3 and 4. In some instances, the determined at least one data parameter can be based on a GPU composition, as described in connection with the examples in FIGS. 3 and 4.

At 504, the apparatus can calculate a model for the at least one data parameter corresponding to each of the plurality of layers, as described in connection with the examples in FIGS. 3 and 4. In some aspects, a hash table can correspond to the model for the at least one data parameter corresponding to each of the plurality of layers, as described in connection with the examples in FIGS. 3 and 4. At 506, the apparatus can store the model for the at least one data parameter corresponding to each of the plurality of layers, as described in connection with the examples in FIGS. 3 and 4.

In some aspects, the model can be stored in a persist memory, as described in connection with the examples in FIGS. 3 and 4.

At 508, the apparatus can modify the model for the at least one data parameter based on one or more application use cases of the display frame, as described in connection with the examples in FIGS. 3 and 4. In some aspects, the one or more application use cases of the display frame can include at least one of: one or more display use cases, one or more customizations, or one or more third party applications, as described in connection with the examples in FIGS. 3 and 4. At 510, the apparatus can perform the one or more application use cases of the display frame to modify the model, as described in connection with the examples in FIGS. 3 and 4.

At 512, the apparatus can determine one or more composition settings for each of the plurality of layers based on the modified model, as described in connection with the examples in FIGS. 3 and 4. At 514, the apparatus can implement the modified model on each of the plurality of layers in the display frame, as described in connection with the examples in FIGS. 3 and 4. In some aspects, a compositor can implement the modified model on each of the plurality of layers in the display frame, as described in connection with the examples in FIGS. 3 and 4. At 516, the apparatus can apply the one or more composition settings to each of the plurality of layers based on the modified model, as described in connection with the examples in FIGS. 3 and 4.

At 518, the apparatus can receive feedback based on the one or more composition settings for each of the plurality of layers based on the modified model, as described in connection with the examples in FIGS. 3 and 4. In some aspects, the feedback can be received from a hardware composer, as described in connection with the examples in FIGS. 3 and 4. At 520, the apparatus can modify the model for the at least one data parameter based on the received feedback, as described in connection with the examples in FIGS. 3 and 4. At 522, the apparatus can modify the determined at least one data parameter corresponding to each of the plurality of layers based on the received feedback, as described in connection with the examples in FIGS. 3 and 4.

In one configuration, a method or apparatus for graphics processing is provided. The apparatus may be a compositor, a frame compositor, a composer, a hardware composer, a frame composer, a frame processor, a display processor, a display processing unit (DPU), a CPU, a GPU, or an apparatus for frame or graphics processing. In one aspect, the apparatus may be the processing unit 120 within the device 104, or may be some other hardware within device 104 or another device. The apparatus may include means for determining at least one data parameter corresponding to each of a plurality of layers in a display frame. The apparatus may also include means for calculating a model for the at least one data parameter corresponding to each of the plurality of layers. The apparatus may also include means for modifying the model for the at least one data parameter based on one or more application use cases of the display frame. The apparatus may also include means for implementing the modified model on each of the plurality of layers in the display frame. The apparatus may also include means for determining one or more composition settings for each of the plurality of layers based on the modified model. The apparatus may also include means for applying the one or more composition settings to each of the plurality of layers based on the modified model. The apparatus may also include means for receiving feedback based on the one or more composition settings for each of the plurality of layers based on the modified model. The apparatus may also include means for modifying the model for the at least one data parameter based on the received feedback. The apparatus may also include means for modifying the determined at least one data parameter corresponding to each of the plurality of layers based on the received feedback. The apparatus may also include means for storing the model for the at least one data parameter corresponding to each of the plurality of layers. The apparatus may also include means for performing the one or more application use cases of the display frame to modify the model.

The subject matter described herein can be implemented to realize one or more benefits or advantages. For instance, the described graphics processing techniques can be used by compositors, frame compositors, composers, hardware composers, frame composers, frame processors, display processors, DPUs, CPUs, GPUs, or other frame or graphics processors to enable the aforementioned learning models for partial GPU composition. This can also be accomplished at a low cost compared to other frame or graphics processing techniques. Moreover, the frame or graphics processing techniques herein can improve or speed up data processing or execution. Further, the frame or graphics processing techniques herein can improve a CPU's or GPU's resource or data utilization and/or resource efficiency. Additionally, the frame or graphics processing techniques herein can include partial GPU compositions that utilize a low amount of power and do not interfere with other application processing. Partial GPU compositions herein can also reduce the processing time in order to reduce the amount of janks.

In accordance with this disclosure, the term "or" may be interrupted as "and/or" where context does not dictate otherwise. Additionally, while phrases such as "one or more" or "at least one" or the like may have been used for some features disclosed herein but not others, the features for which such language was not used may be interpreted to have such a meaning implied where context does not dictate otherwise.

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium. Computer-readable media may include computer data storage media or communication media including any medium that facilitates transfer of a computer program from one place to another. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. By way of example, and not limitation, such computer-readable media can comprise RAM, ROM, EEPROM, CD-ROM or other optical disk storage, magnetic disk storage or other magnetic storage devices. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. A computer program product may include a computer-readable medium.

The code may be executed by one or more processors, such as one or more digital signal processors (DSPs), general purpose microprocessors, application specific integrated circuits (ASICs), arithmetic logic units (ALUs), field programmable logic arrays (FPGAs), or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs, e.g., a chip set. Various components, modules or units are described in this disclosure to emphasize functional aspects of devices configured to perform the disclosed techniques, but do not necessarily need realization by different hardware units. Rather, as described above, various units may be combined in any hardware unit or provided by a collection of interoperative hardware units, including one or more processors as described above, in conjunction with suitable software and/or firmware.

Various examples have been described. These and other examples are within the scope of the following claims.

What is claimed is:

1. A method of display processing, comprising:
   determining at least one data parameter corresponding to each of a plurality of layers in a display frame, wherein the at least one data parameter corresponding to each of a plurality of layers includes a geometry and a vendor process composition decision of each layer;
   calculating a model for the at least one data parameter corresponding to each of the plurality of layers;
   modifying the model for the at least one data parameter based on one or more application use cases of the display frame; and
   implementing the modified model on each of the plurality of layers in the display frame.

2. The method of claim 1, further comprising:
   determining one or more composition settings for each of the plurality of layers based on the modified model.

3. The method of claim 2, further comprising:
   applying the one or more composition settings to each of the plurality of layers based on the modified model.

4. The method of claim 2, further comprising:
   receiving feedback based on the one or more composition settings for each of the plurality of layers based on the modified model.

5. The method of claim 4, further comprising:
   modifying the model for the at least one data parameter based on the received feedback.

6. The method of claim 4, further comprising:
   modifying the determined at least one data parameter corresponding to each of the plurality of layers based on the received feedback.

7. The method of claim 4, wherein the feedback is received from a hardware composer.

8. The method of claim 1, further comprising:
   storing the model for the at least one data parameter corresponding to each of the plurality of layers.

9. The method of claim 8, wherein the model is stored in a persist memory.

10. The method of claim 1, further comprising:
    performing the one or more application use cases of the display frame to modify the model.

11. The method of claim 1, wherein a hash table corresponds to the model for the at least one data parameter corresponding to each of the plurality of layers.

12. The method of claim 1, wherein the one or more application use cases of the display frame include at least one of: one or more display use cases, one or more customizations, or one or more third party applications.

13. The method of claim 1, wherein the determined at least one data parameter is based on a graphics processing unit (GPU) composition.

14. The method of claim 1, wherein a compositor implements the modified model on each of the plurality of layers in the display frame.

15. An apparatus for display processing, comprising:
    a memory; and
    at least one processor coupled to the memory and configured to:
    determine at least one data parameter corresponding to each of a plurality of layers in a display frame, wherein the at least one data parameter corresponding to each of a plurality of layers includes a geometry and a vendor process composition decision of each layer;
    calculate a model for the at least one data parameter corresponding to each of the plurality of layers;
    modify the model for the at least one data parameter based on one or more application use cases of the display frame; and
    implement the modified model on each of the plurality of layers in the display frame.

16. The apparatus of claim 15, wherein the at least one processor is further configured to:
    determine one or more composition settings for each of the plurality of layers based on the modified model.

17. The apparatus of claim 16, wherein the at least one processor is further configured to:
    apply the one or more composition settings to each of the plurality of layers based on the modified model.

18. The apparatus of claim 16, wherein the at least one processor is further configured to:
    receive feedback based on the one or more composition settings for each of the plurality of layers based on the modified model.

19. The apparatus of claim 18, wherein the at least one processor is further configured to:
    modify the model for the at least one data parameter based on the received feedback.

20. The apparatus of claim 18, wherein the at least one processor is further configured to:
    modify the determined at least one data parameter corresponding to each of the plurality of layers based on the received feedback.

21. The apparatus of claim 18, wherein the feedback is received from a hardware composer.

22. The apparatus of claim 15, wherein the at least one processor is further configured to:
    store the model for the at least one data parameter corresponding to each of the plurality of layers.

23. The apparatus of claim 22, wherein the model is stored in a persist memory.

24. The apparatus of claim 15, wherein the at least one processor is further configured to:

perform the one or more application use cases of the display frame to modify the model.

25. The apparatus of claim 15, wherein a hash table corresponds to the model for the at least one data parameter corresponding to each of the plurality of layers.

26. The apparatus of claim 15, wherein the one or more application use cases of the display frame include at least one of: one or more display use cases, one or more customizations, or one or more third party applications.

27. The apparatus of claim 15, wherein the determined at least one data parameter is based on a graphics processing unit (GPU) composition.

28. The apparatus of claim 15, wherein a compositor implements the modified model on each of the plurality of layers in the display frame.

29. An apparatus for display processing, comprising:
- means for determining at least one data parameter corresponding to each of a plurality of layers in a display frame, wherein the at least one data parameter corresponding to each of a plurality of layers includes a geometry and a vendor process composition decision of each layer;
- means for calculating a model for the at least one data parameter corresponding to each of the plurality of layers;
- means for modifying the model for the at least one data parameter based on one or more application use cases of the display frame; and
- means for implementing the modified model on each of the plurality of layers in the display frame.

30. A non-transitory computer-readable medium storing computer executable code for display processing, comprising code to:
- determine at least one data parameter corresponding to each of a plurality of layers in a display frame, wherein the at least one data parameter corresponding to each of a plurality of layers includes a geometry and a vendor process composition decision of each layer;
- calculate a model for the at least one data parameter corresponding to each of the plurality of layers;
- modify the model for the at least one data parameter based on one or more application use cases of the display frame; and
- implement the modified model on each of the plurality of layers in the display frame.

* * * * *